United States Patent [19]

Imaeda et al.

[11] Patent Number: 5,140,156

[45] Date of Patent: Aug. 18, 1992

[54] HIGH SENSITIVITY OPTICAL MAGNETIC FIELD SENSORS HAVING A MAGNETOOPTICAL GARNET-TYPE FERRITE POLYCRYSTAL

[75] Inventors: Minoru Imaeda; Emi Asai; Katsunori Okamoto, all of Nagoya, Japan

[73] Assignee: NGK Insulators, Ltd., Japan

[21] Appl. No.: 572,227

[22] Filed: Aug. 24, 1990

[30] Foreign Application Priority Data

Aug. 29, 1989 [JP] Japan .................................. 1-220177

[51] Int. Cl.$^5$ ................................................ H01J 5/16
[52] U.S. Cl. .................................. 250/227.21; 324/96
[58] Field of Search ............... 250/227.21, 225, 227.25; 356/368; 324/96

[56] References Cited

U.S. PATENT DOCUMENTS

| 4,896,103 | 1/1990 | Shimanuki et al. | 324/96 |
| 4,947,107 | 8/1990 | Doerfler et al. | 324/96 |
| 4,973,899 | 11/1990 | Jones | 324/96 |

FOREIGN PATENT DOCUMENTS

| 0086387 | 1/1983 | European Pat. Off. |
| 0345759 | 12/1989 | European Pat. Off. |
| 63-107900 | 5/1988 | Japan |
| 63-259618 | 2/1989 | Japan |

*Primary Examiner*—David C. Nelms
*Assistant Examiner*—T. Davenport
*Attorney, Agent, or Firm*—Parkhurst, Wendel & Rossi

[57] ABSTRACT

A high sensitivity optomagnetical sensor comprising a light source, a magnetic field-detecting section, a light-receiving section for receiving light emitted from the light source through the magnetic field-detecting section, a measurement-controlling section for controlling the light source, the magnetic field-detecting section, and the light-receiving section, and for measuring an intensity of light received by the light-receiving section, and light transmission paths using optical fibers for optically connecting the light-source section and the magnetic field-detecting section and optically connecting the magnetic field-detecting section and the light-receiving section. The magnetic field-detecting section is constituted by a polarizer, an analyzer and a magnetooptical element arranged between the polarizer and the analyzer. A garnet type ferrite polycrystal is used as a magnetooptical element of the sensor. The ferrite polycrystal has a Verdet constant of not less than 1 deg/cm.Oe, a thickness of not less than 100 $\mu$m, a light transmittance of not less than 10%, a temperature dependency on detecting the magnetic field in a temperature range of $-20°$ to $+60°$ C. being within $\pm 1.0\%$, a magnetic field-detecting precision of not more than 1/10,000, and a composition of $Bi_xGd_yY_zFe_5O_{12}$ ($X+Y+Z=3$).

2 Claims, 3 Drawing Sheets

HIGH SENSITIVITY OPTICAL MAGNETIC FIELD SENSORS HAVING A MAGNETOOPTICAL GARNET-TYPE FERRITE POLYCRYSTAL

BACKGROUND OF THE INVENTION

1. Field of the Invention

The present invention relates to optical magnetic field sensors utilizing a magnetooptical effect of magnetic garnet materials. In particular, the present invention relates to optical magnetic field sensors which have high sensitivity and excellent magnetooptical characteristics and which are to be used for detecting accidents such as earthing in power distribution lines.

2. Related Art Statement

Electrical type measuring instruments have conventionally been used as measurement instruments for controlling electric current and voltage in an electric power field using high voltage and high electric current. For this purpose, the measuring instruments must be of a very large size and have high insulation reliability so that the measuring instruments themselves may not be a cause for earthing or shorting accidents. Thus, there are problems in that the cost is high and a large installation area is necessary.

In order to solve the problems of the above-mentioned measurement instruments, optical magnetic field sensors in which a Faraday element having a magnetooptical effect (for example, a magnetic garnet material) is combined with an optical fiber are disclosed in K. KYUWA et al., IEEE Journal of Quantum Electronics, Vol. QE-18, No. 10, 1619 (1982)).

The optical magnetic field sensor of this type comprises a light source section composed of a light emitting diode or the like, a magnetic field-detecting section constituted by interposing a Faraday element made of, for example, a magnetic garnet material, between a polarizer and an analyzer, a measurement circuit for receiving and measuring light emitted from the light source section and passing through the magnetic field-detecting section, and light transmission paths using optical fibers for optically connecting these sections. Owing to this construction, since the magnetic field-detection section is merely optically connected with the measuring circuit by the optical fiber, but electrically insulated therefrom, insulating reliability is high, and since the light transmission section is constituted by the optical fibers, they do not undergo electromagnetic induction so that a magnetic field detector having a sufficient measuring precision can be installed at a low cost by simple means.

The above magnetic garnet material is known to have a particularly great magnetic field-detecting sensitivity (Verdet constant) among Faraday elements such as Faraday glass and bismuth silicon oxide. Therefore, in order to improve the characteristics of the optical magnetic field sensors, various contrivances have been made on the magnetic garnet material having the Faraday effect.

For example, Japanese patent application Laid-open Nos. 62-150,185 and 62-188,982 propose that the magnetic field can be measured at high precision by specifying the orientations of planes of the magnetic garnet single crystal material. Further, Japanese patent application Laid-open No. 63-163,815 proposes that a polycrystal of magnetic garnet is made transparent by adding calcium thereto to make it possible to measure the magnetic field at high precision.

However, an FZ process, an LPE process, a flux process or the like are generally used as production processes for producing the single crystal materials of the above-mentioned magnetic garnet. However, since these processes grow single crystals from a melt of garnet, they suffer problems in that specialized equipment is necessary, mass productivity is poor, and variations in the characteristics of the materials are likely to occur.

Although the magnetic garnet polycrystal which is made transparent by adding calcium as mentioned above has a better mass productivity than the above-mentioned single crystal materials, the polycrystal has the following problems. That is, it first suffers the problem that when calcium is added, sensitivity of the sensor drops because the magnetooptical characteristics, i.e., the Faraday rotation angle and the Verdet constant become smaller. Next, since vanadium needs to be added to supplement charges of calcium, the kinds of elements to be mixed during the production becomes greater Consequently, an inner portion of a sintered body is likely to become inhomogeneous so that variations of the magnetooptical characteristics of the sensor are likely to occur.

When these magnetic garnet materials are used as optical magnetic field sensors for the power distribution, the sensitivity of the magnetooptical element, uniformity of the element and its output stability are sometimes inadqueate. Earthing accidents in the power distribution are detected by arranging three optical magnetic field sensors in three phase power distribution line, uniting their detected magnetic fields, and detecting about 100 mA earthing current in the case of a load current being 600 A. Therefore, a detecting precision of not more than 1/10,000 is required.

In order to reduce the weight of the sensors in the power distribution lines, structures without iron cores are desired. Particularly, magnetic garnet materials having high sensitivity is demanded.

SUMMARY OF THE INVENTION

The object of the present invention is to solve magnetic field sensors having high sensitivity, high output stability, and uniform magnetic field-detecting characteristics.

The high sensitivity optical magnetic field sensor according to the present invention comprises a light source section, a magnetic field-detecting section, a light-receiving section for receiving light emitted from the light source section and passing through the magnetic field-detecting section, a measurement-controlling section for controlling the light source, the magnetic field-detecting section, and the light-receiving section and for measuring an intensity of light received by the light-receiving section, and light transmission paths using optical fibers for optically connecting the light source section and the magnetic field-detecting section and optically connecting the magnetic field-detecting section and the light-receiving section, said magnetic field-detecting section being constituted by a polarizer, an analyzer and a magnetooptical element arranged between the polarizer and the analyzer, wherein a garnet type ferrite polycrystal is used as a magnetooptical element, said ferrite polycrystal has a Verdet constant of not less than 1 deg/cm.Oe, a thickness of not less than 100 $\mu$m, a light transmittance of not less than 10%, a temperature dependency on detecting the magnetic field in a temperature range of −20 to +60° C. being within ±1.0%, a magnetic field-detecting precision of not more than 1/10,000, and a composition of $Bi_xGd_yY_zFe_5O_{12}$ ($X+Y+Z=3$).

Since the above-constituted optical magnetic field sensor uses, as the magnetooptical element, the garnet type ferrite polycrystal having given magnetooptical characteristics, sufficient magnetic field-detecting precision, and the composition of $Bi_xGd_yY_zFe_5O_{12}$ ($X+Y+Z=3$), the magnetic field Can stably be detected at such a high sensitivity as to make it possible to use the optical magnetic field sensor for the detection of earthing accidents in the case of the power distribution.

These and other objects, features and advantages of the invention will be appreciated upon reading of the following description of the invention when taken with the attached drawings, with the understanding that some modifications, variations and changes of the same could easily be made by the skilled person in the art to which the invention pertains without departing from the spirit of the invention or the scope of claims appended hereto.

BRIEF DESCRIPTION OF THE ATTACHED DRAWINGS

For a better understanding of the invention, reference is made to the attached drawings, wherein.

DETAILED DESCRIPTION OF THE INVENTION

Figure 1:
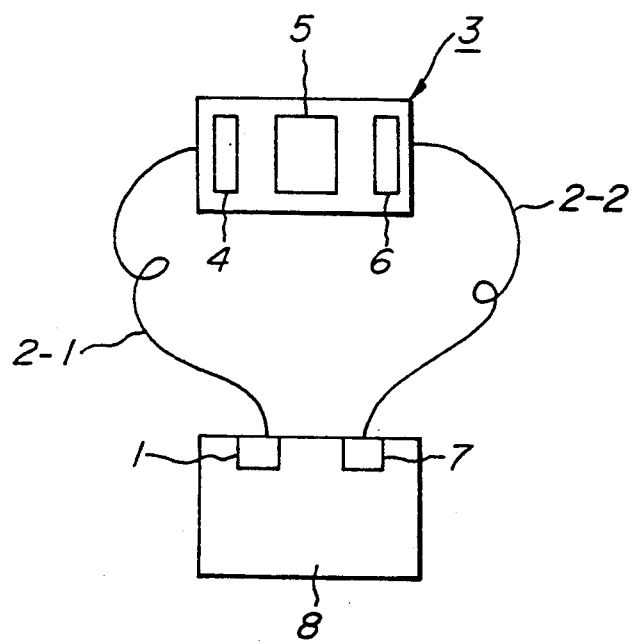
FIG. 1 is a diagram diagrammatically showing a construction of an optical magnetic field sensor according to the present invention.

Now, limitations of the magnetooptical characteristics, the composition and the producing process of the magnetic garnet type ferrite polycrystal to be used in the present invention will be explained.

The magnetooptical characteristics of the polycrystal will first be explained. When a load current of about 600 A flowing through a power distribution line is detected by an optical magnetic field sensor spaced from the power distribution line by about 20 mm, the magnetic field is about 60 Oe at a location of the sensor. Owing to this, when a Faraday rotation angle of not less than 0.5 deg giving rise to a sufficient SN ratio in the optical magnetic field detector is to be obtained, an element having a Verdet constant of not less than 1 deg/cm.Oe and a thickness of not less than 100 μm is required. This is understood from the fact that the Faraday rotation angle as a characteristic of the element is expressed by the following equation:

$$\Theta F = V.L.H$$

in which ΘF, V, L and H are the Faraday rotation angle (deg), the Verdet constant (deg/cm.Oe), the thickness of the element (cm), and the magnetic field (Oe), respectively.

The Verdet constant is a value measured by using a helium-neon laser having a wavelength of 1.15 μm. Lasers having wavelengths of 1.3 μm and 1.55 μm generally used at present for long distance light transmission are about 0.75 times and about 0.5 time as much as the above value, respectively.

The light transmittance of magnetic garnet is considered to be related to absorption of light inside the garnet and attenuation due to reflection at the surface thereof. The internal light absorption is expressed by the following equation:

$$I/Io = e^{-\alpha L}$$

in which I, Io and α are an intensity of a light emitted, intensity of an incident light (excluding a reflected light), and a light absorption coefficient, respectively. Since this effect is an exponent function of a product between the light absorption coefficient and the thickness of the element, it is necessary to make the absorption coefficient smaller so that the thickness of the element is increased to obtain a sufficient sensitivity. Further, since an effect due to the reflection can be reduced to about 1% by a treatment such as an antireflection coating, it is not considered here. However, it is known that about 30% of light may be reflected by magnetic garnet depending upon the refractive index.

The reason why the light transmittance is limited to not less than 10% is that since an amount of the light incident upon a light measuring section for receiving and measuring the light is greater when the transmittance is higher, measurement is possible at higher precision, and that when the transmittance is less than 10%, it is difficult to effect the measurement at a precision of not more than 1/10,000.

The temperature dependency in the detection of the magnetic field in temperature range of −20 to +60° C. needs to be within ±1.0%. For, when the temperature dependency is outside ±1.0% in the temperature range of −20 to +60° C. anticipated in actual use, the sensor used as a detector for detecting earthing or shorting accidents may erroneously indicate that earthing or shorting occurred due to temperature change.

The reason why the garnet type ferrite polycrystal having a composition of $Bi_xGd_yY_zFe_5O_{12}$ ($X+y+Z=3$) is used as the magnetooptical element is that it is known that the Faraday rotation angle is greatly increased by replacing locations of rare earth elements of rare earth-iron garnet by bismuth, the garnet type ferrite polycrystal is considered to be a material giving a Verdet constant of not less than 1 deg/cm.Oe among Faraday materials currently available, and it is considered that the temperature dependency within ±1.0% in the temperature range of −20 to +60° C. on the detection of the magnetic field can be realized by limiting the kinds of rare earth elements used to Gd and Y.

It is preferable that amounts of components are set to satisfy the requirements that $0.7 < x < 1.5$, $0.3 < Y/Z < 0.6$, and $X+Y+Z=3$, because a desired garnet type ferrite polycrystal is readily obtained when the above requirements are satisfied.

A process is known from Japanese patent application Laid-open No. 56-162,715 for improving the temperature dependency of the magnetooptical characteristics such as the Faraday rotation angle by replacing a part of yttrium of the bismuth-substituted yttrium-iron garnet by gadolinium.

Further, as a process for producing the garnet type ferrite polycrystal as the magnetooptical element, it is preferable to use a process in which the polycrystal is made transparent by HIP treatment after the composition is controlled to an intended composition with molar variations in a range of ±0.05 molar %. The reason is that the thus controlled composition is highly densified to 99.99%, and made transparent relative to infrared rays by HIP treatment. On the other hand, a material having a composition deviated from the intended composition to the outside of the range of ±0.05 molar % is not made fully transparent even by HIP treatment, and thus difficult to use as an optical magnetic field sensor. Further, even though the density of the polycrystal having undergone no HIP treatment was around 99.8%, it could not be used as the optical element.

Figure 2:
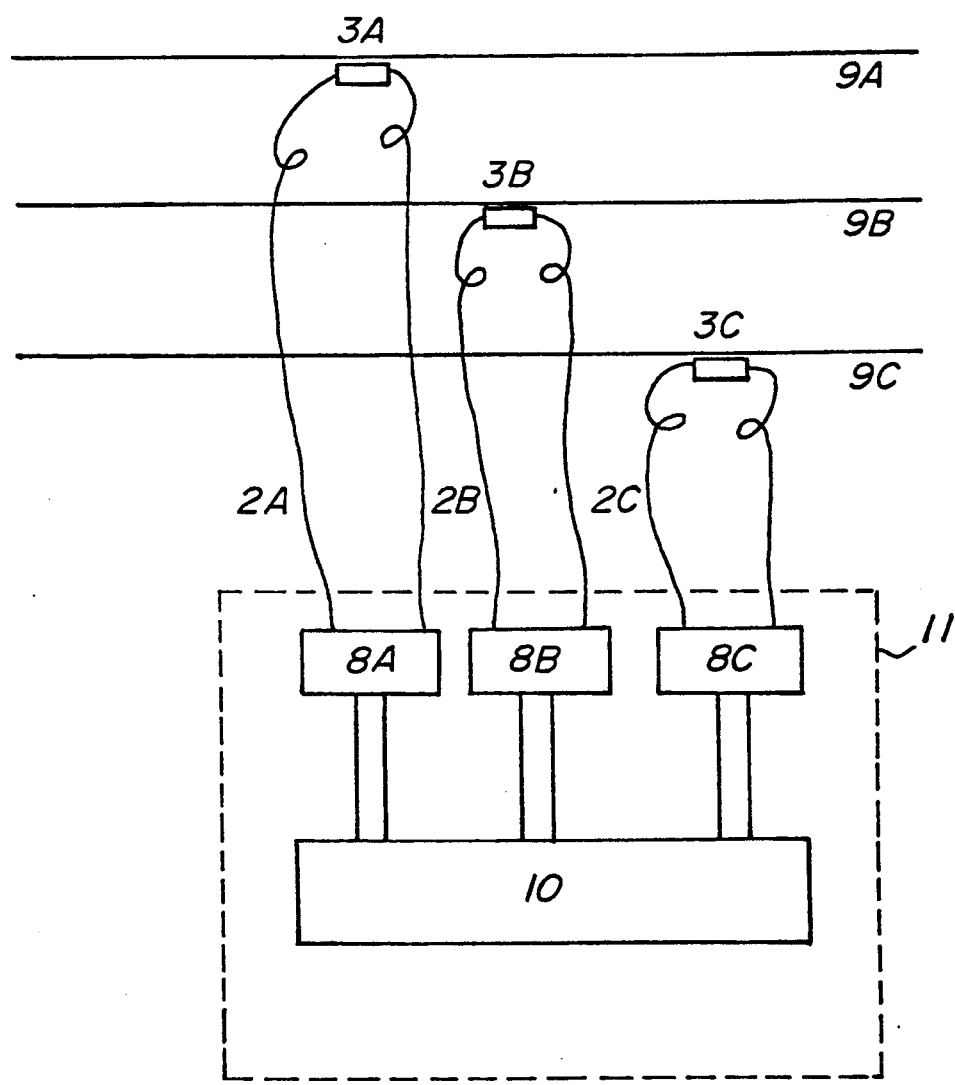
FIG. 2 shows a diagram illustrating a construction of a device for detecting accidents such as earthing in power distribution lines.
Figure 3:
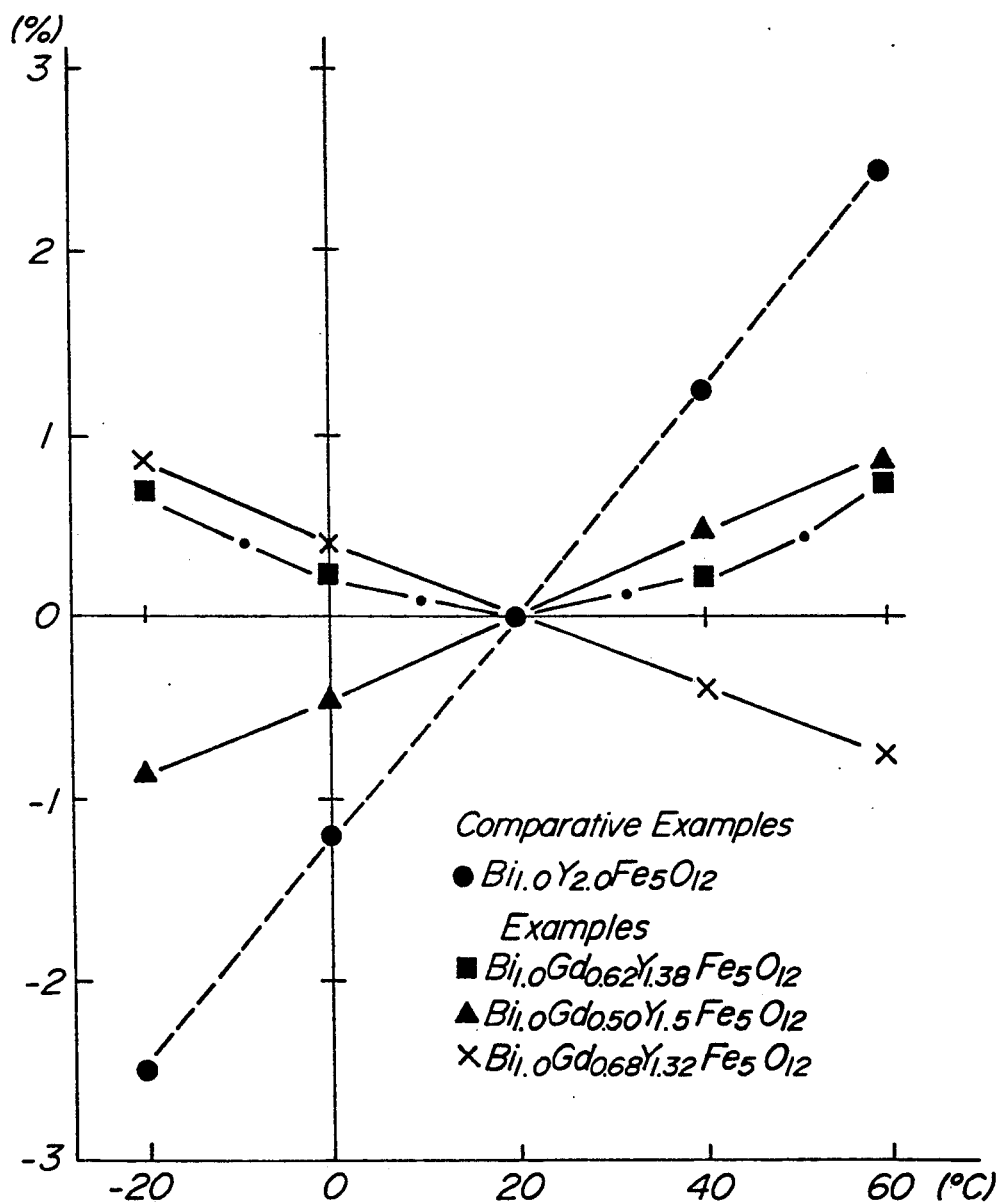
FIG. 3 is a graph showing changes of temperature-output characteristics.

FIG. 1 shows a diagram illustrating a construction of the optical magnetic field sensor according to the present invention. In FIG. 1, 1, 2-1, 2-2, and 3 are a light source for emitting light, optical fibers constituting light transmission paths, and a magnetic field-detecting section constituted by a polarizer 4, a Faraday element 5 and an analyzer 6, respectively. 7 is an light-receiving element for receiving light emitted from the light source 1 through the optical fiber 2-1, the magnetic field-detecting section 3 and the optical fiber 2-2, and 8 is a measurement controlling section for controlling the above sections and measuring the light received by the light-receiving element.

The principle of the optical magnetic field sensor will be explained. First, when a light beam emitted from the light source 1 (for example, an LED having a wavelength of 1.3 μm) passes the polarizer 4 of the magnetic field-detecting section 3 through the optical fiber 2-1, it becomes linearly polarized light. When this linearly polarized light passes the Faraday element 5 to which an external magnetic field is applied, the light undergoes a Faraday rotation in proportion to the intensity of the magnetic field. Consequently, the intensity of the light emitted from the analyzer 6 is changed in proportion to the intensity of the magnetic field.

With respect to the measurement controlling section 8, a division circuit is used for converting the light received by the light-receiving element 7 through the optical fiber 2-2 to a voltage proportional to the intensity of the light, separating a DC portion from an AC portion, and converting the former to a magnetic field. By so doing, a variation in intensity of the light emitted from the analyzer can be read as a voltage value proportional to the magnetic field to be measured. Further, in order to detect current in an earthing accident of a three-phase AC, a circuit is used for reading an accidental current from a voltage value. With respect to the measurement controlling section 8, various systems other than the dividing circuit system are known, and the effects intended can be obtained by the optical magnetic field sensor according to the present invention irrespective of the types of the electric circuits.

FIG. 2 shows a diagram illustrating a construction of a device for detecting accidents such as earthing in power distribution lines.

In FIG. 2, reference numerals 2A-2C, 3A-3C, and 8A-8C denote the same members as denoted by 2-1 and 2-2, 3 and 8 in FIG. 1, and 9A-9C are three phase conductors of a power distribution line. Reference numerals 10 and 11 denotes a current signal synthesizing circuit, and a unit for measuring and indicating accidents such as earthing, respectively.

Under normal condition, currents in the three phase power line conductors (9A, 9B, 9C) are balanced and a zero-phase sequence current in the three phase power line conductor is zero and the signal from the current signal synthesizing circuit is also zero.

But, when there is an unbalanced fault in the three-phase power line, the signal from the current signal synthesizing circuit becomes a finite value depending on the type of fault.

When the accident of earthing happens, the zero-phase-sequence current in the three phase power line conductors becomes a value of from 100 mA to 5 A.

The detecting precision of magnet field can be reduced to not more than 1/10,000 by this magnetic garnet materials, so 100 mA earthing current can be detected in the case of a load current being 600 A.

As to the process for producing the magnetooptical element to be used as the detecting section of the optical magnetic field sensor, as mentioned above, a single crystal material obtained by a flux process or the like, and the polycrystal material which is made transparent by adding calcium are known. However, these magnetooptical elements have the above-mentioned drawbacks, and pose a problem when they are used in optical magnetic field sensors for detecting earthing or shorting in the power distribution.

In the following, a process for obtaining a bismuth-substituted rare earth-iron garnet polycrystal having a sufficient sensitivity and output stability as a magnetooptical element of the optical magnetic field sensor for detecting earthing or shorting in the power distribution, and possessing uniform magnetooptical characteristics will be given.

As a process for preparing powder of a raw material, a process is employed in which a mixed aqueous solution containing iron (III) nitrate, bismuth nitrate, and nitrates of yttrium and gadolinium is used as a starting material, this mixed aqueous solution of these metallic salts is dropwise added into an aqueous solution of a base to co-precipitate hydroxides, and the hydroxide is separated from the aqueous solution, and dried, calcined and milled. The reason why neither chlorides nor sulfates are used is that if these salts are present in the co-precipitated hydroxides and if the co-precipitate contains an oxide such as bismuth oxide having a low melting point, release of anions thereof is a speed-controlling step, and a temperature for converting the powder to garnet becomes higher, so that fully densified sintered bodies cannot be obtained by post processing.

As a base to be used as a co-precipitating agent, it is preferable to use a base containing no metallic ions, such as ammonia water or tetramethylammonium hydroxide. Further, it is effective that another anions are prevented from being co-precipitated by co-existing carbonate ions in the mixed aqueous solution.

The composition of each of the thus produced powders having slightly different contents of bismuth is controlled within a deviation range of ±0.05 molar % with respect to the intended composition by mixing two kinds of the powders at a given ratio. Then, the powder is shaped, fired, and highly densified by hot isostatic press. Thereby, a bismuth-substituted YIG polycrystal having a porosity of not more than 0.01% and a light absorption coefficient of not more than 50 $cm^{-1}$ at a wavelength of 1.3 μm is obtained. Elements having a light absorption coefficient of not more than 1 $cm^{-1}$ at the most can be obtained by more finely controlling the composition, and examining the firing conditions and HIP conditions.

The thus obtained element has sufficient sensitivity and output stability as the optical magnetic field sensor element for detecting earthing accident in the power distribution line, and the characteristics of the element are uniform.

Actual examples will be explained below.

EXAMPLES

With respect to each of compositions of $Bi_{1.0}Gd_{0.62}Y_{1.38}Fe_5O_{12}$, $Bi_{1.0}Gd_{0.50}Y_{1.50}Fe_5O_{12}$ and $Bi_{1.0}Gd_{0.68}OY_{1.32}Fe_5O_{12}$, two kinds of aqueOUS solutions in which bismuth nitrate, gadolinium nitrate, yttrium nitrate and iron nitrate were mixed while amounts of a bismuth-substituting elements in the solutions were slightly changed such that the contents of the bismuth-substituting elements in the composition fall between those in the solutions. Each of the solutions was dropwise added into ammonia aqueous solution, thereby obtaining a co-precipitate powder of a hydroxide having an intended composition. The co-precipitate was separated from the solution, dried, calcined at 700° C., and milled to obtain fine powder of which almost 100% was converted to garnet. These two kinds of the powders were mixed such that the content of Fe in the composition was changed 0.05 mole by 0.05 mole, press molded, and fired at 950° C. for 10 hours in oxygen atmosphere. Each of the fired bodies was worked to a size of 5×5×5 mm, and treated by HIP at 950° C. under pressure of 1,500 atms in argon atmosphere. As a result, as shown in Table 1 by way of example, samples having composition falling inside the scope of the present invention were translucent polycrystalline (absorption coefficient=1). The polycrystal has a uniform grain diameter with the average grain diameter of 2 to 3 μm. A great amount of polycrystals having this composition was prepared, and translucent polycrystals were produced by the similar treatment.

The obtained materials were worked to a size of 3×5 mm, while the thickness was varied among 50, 100, 200, 500 and 1,000 μm. Opposite surfaces of each of the materials were optically polished (Since the surface of the material has no antireflection coating, the light transmittance is about 70% even when completely no absorption occurred). After magnetooptical characteristics of the Faraday rotation angle, the Verdet constant, the saturated magnetization and the light transmittance were measured with respect to each of the thus obtained elements, the element was assembled as an optical magnetic field sensor as shown in FIG. 1. Then, an AC magnetic field of 60 Oe was applied at 50 Hz, and the output-temperature characteristic and the output stability in detecting of the magnetic field in the range of −20 to +60° C. were measured with respect to the voltage outputted from the measurement controlling section of the division circuit system. Table 2 shows measurement results with respect to the composition of $Bi_{1.0}Gd_{0.62}Y_{1.38}Fe_5O_{12}$, and Tables 3 and 4 show those of the compositions of $Bi_{1.0}Gd_{0.5}OY_{1.50}Fe_5O_{12}$ and $Bi_{1.0}Gd_{0.68}Y_{1.32}Fe_5O_{12}$, respectively.

TABLE 1

| Fe (molar %) in formulated composition | 62.50 | 62.55 | 62.60 | 62.65 | 62.70 |
|---|---|---|---|---|---|
| Absorption coefficient (cm$^{-1}$) | 60 | 10 | 1 | 25 | 80 |

TABLE 2

(Fe: 62.60 molar %)

| Thickness of element (μm) | Faraday rotation angle (deg/cm) | Verdet constant (deg/cm · Oe) | Saturated magnetization (Oe) | Light transmittance (%) | Temperature dependency of output (%) | Output stability (%) |
|---|---|---|---|---|---|---|
| 50 | 2200 | 1.4 | 1700 | 70 | ±0.3 | ±0.03 |
| 100 | 2200 | 1.4 | 1700 | 70 | ±0.3 | ±0.008 |
| 200 | 2200 | 1.4 | 1700 | 65 | ±0.3 | ±0.007 |
| 500 | 2200 | 1.4 | 1700 | 60 | ±0.3 | ±0.007 |
| 1000 | 2200 | 1.4 | 1700 | 55 | ±0.3 | ±0.006 |

Note: Output stability denotes the magnetic field-detecting precision
The composition was $Bi_{1.0}Gd_{0.62}Y_{1.38}Fe_5O_{12}$.

TABLE 3

(Fe: 62.60 molar %)

| Thickness of element (μm) | Faraday rotation angle (deg/cm) | Verdet constant (deg/cm · Oe) | Saturated magnetization (Oe) | Light transmittance (%) | Temperature dependency of output (%) | Output stability (%) |
|---|---|---|---|---|---|---|
| 50 | 2200 | 1.4 | 1800 | 70 | ±0.8 | ±0.03 |
| 100 | 2200 | 1.4 | 1800 | 70 | ±0.8 | ±0.008 |
| 200 | 2200 | 1.4 | 1800 | 65 | ±0.8 | ±0.007 |
| 500 | 2200 | 1.4 | 1800 | 60 | ±0.8 | ±0.007 |
| 1000 | 2200 | 1.4 | 1800 | 55 | ±0.8 | ±0.006 |

Note: Output stability denotes the magnetic field-detecting precision
The composition was $Bi_{1.0}Gd_{0.50}Y_{1.50}Fe_5O_{12}$.

TABLE 4

(Fe: 62.55 molar %)

| Thickness of element (μm) | Faraday rotation angle (deg/cm) | Verdet constant (deg/cm · Oe) | Saturated magnetization (Oe) | Light transmittance (%) | Temperature dependency of output (%) | Output stability (%) |
|---|---|---|---|---|---|---|
| 50 | 2200 | 1.4 | 1600 | 70 | ±0.7 | ±0.03 |
| 100 | 2200 | 1.4 | 1600 | 70 | ±0.7 | ±0.008 |
| 200 | 2200 | 1.4 | 1600 | 65 | ±0.7 | ±0.007 |

TABLE 4-continued (Fe: 62.55 molar %)

| Thickness of element (μm) | Faraday rotation angle (deg/cm) | Verdet constant (deg/cm · Oe) | Saturated magnetization (Oe) | Light transmittance (%) | Temperature dependency of output (%) | Output stability (%) |
|---|---|---|---|---|---|---|
| 500 | 2200 | 1.4 | 1600 | 60 | ±0.7 | ±0.007 |
| 1000 | 2200 | 1.4 | 1600 | 55 | ±0.7 | ±0.006 |

Note: Output stability denotes the magnetic field-detecting precision
The composition was $Bi_{1.0}Gd_{0.68}Y_{1.32}Fe_5O_{12}$.

COMPARATIVE EXAMPLES

A translucent polycrystal was produced by the same process as in Examples except that the composition was $Bi_{1.0}Y_{2.0}Fe_5O_{12}$. Results are given in Table 5.

With respect to the thus obtained polycrystals, the Faraday rotation angle, the Verdet constant, the saturated magnetization, the light transmittance, and the output-temperature characteristic in the detection of the magnetic field in the range form −20° to −60° C. were measured. Results are shown in Table 6.

TABLE 5

| Fe (molar %) in formulated composition | 62.35 | 62.40 | 62.45 | 62.50 | 62.55 |
|---|---|---|---|---|---|
| Absorption coefficient (cm$^{-1}$) | 70 | 20 | 2 | 15 | 60 |

TABLE 6

(Fe: 62.45 molar %)

| Thickness of element (μm) | Faraday rotation angle (deg/cm) | Verdet constant (deg/cm · Oe) | Saturated magnetization (Oe) | Light transmittance (%) | Temperature dependency of output (%) | Output stability (%) |
|---|---|---|---|---|---|---|
| 50 | 2200 | 1.3 | 2100 | 70 | ±2.5 | ±0.03 |
| 100 | 2200 | 1.3 | 2100 | 70 | ±2.5 | ±0.008 |
| 200 | 2200 | 1.3 | 2100 | 65 | ±2.5 | ±0.007 |
| 500 | 2200 | 1.3 | 2100 | 60 | ±2.5 | ±0.007 |
| 1000 | 2200 | 1.3 | 2100 | 55 | ±2.5 | ±0.006 |

Note: Output stability denotes the magnetic field-detecting precision

It is seen from the results Of Examples and Comparative Examples that when the garnet type ferrite polycrystal having the Verdet constant of not less than 1.0 deg/cm.Oe, the thickness of not less than 100 μm, and the given composition is used, the output-temperature characteristic on the detection of the magnetic filed in the range of −20 to +60° C. can favorably be suppressed within ±1.0%. FIG. 3 shows the changes in the output-temperature characteristics.

As is clear from the above-mentioned explanation, according to the high sensitivity optical magnetic field sensor of the present invention, since the garnet type ferrite polycrystal having the desired magnetooptical characteristics, sufficient magnetic field-detecting precision and the temperature characteristics with the composition of $Bi_xGd_yY_zFe_5O_{12}$ is used, the magnetic field can stably be detected at any temperatures within typical use with such high precision that the sensor may be satisfactorily used for detecting earthing accidents on the power distribution.

What is claimed is:

1. A high sensitivity optomagnetical sensor comprising:
    a light source section;
    a magnetic field detecting section;
    a light receiving section for receiving light emitted from the light source section and passing through the magnetic field detecting section;
    a measurement-controlling section for controlling the light source section, the magnetic field detecting section and the light receiving section, and wherein said measurement-controlling section measures an intensity of light received by the light-receiving section; and
    optical fibers for optically connecting the light source section and the magnetic field detecting section, and the magnetic field detecting section and the light-receiving section, wherein said magnetic field detecting section comprises:
    a) a polarizer;
    b) an analyzer; and
    c) a magnetooptical element disposed between the polarizer and analyzer, said magnetooptical element being a garnet-type ferrite polycrystal having a Verdet constant of not less than 1 deg/cm.Oe, a thickness of not less than 10 μm, a light transmittance of not less than 10%, a temperature dependency on detecting the magnetic field in a temperature range of −20° to +60° C. being within ±1.0%, a magnetic field-detecting precision of not more than 1/10,000, and a composition of $Bi_xGd_yY_zFe_5O_{12}$ (x+y+z=3).

2. The high sensitivity optomagnetical sensor of claim 1 wherein components of the composition of the garnet type ferrite polycrystal satisfy requirements that $0.7 < X < 1.5$, $0.3 < Y/Z < 0.6$, and $X+Y+Z=3$.

* * * * *